United States Patent [19]

Tanaka

[11] Patent Number: 4,814,667

[45] Date of Patent: Mar. 21, 1989

[54] LIGHT EMITTING DIODE ARRAY HAVING UNIFORM ILLUMINANCE DISTRIBUTION

[75] Inventor: Toshiaki Tanaka, Yokohama, Japan

[73] Assignee: Kabushiki Kaisha Toshiba, Kanagawa, Japan

[21] Appl. No.: 34,932

[22] Filed: Apr. 6, 1987

[30] Foreign Application Priority Data

Apr. 17, 1986 [JP] Japan ................... 61-87078

[51] Int. Cl.$^4$ ............................. H01L 33/00
[52] U.S. Cl. ................... 313/500; 362/800; 362/252; 355/3 R; 355/67; 355/70; 313/512
[58] Field of Search ............ 313/110, 500, 512; 340/752, 782; 355/67–71, 3 R, 1; 362/11, 227, 252, 800, 223, 235, 236, 241

[56] References Cited

U.S. PATENT DOCUMENTS

| | | | |
|---|---|---|---|
| 4,255,042 | 3/1981 | Armitage, Jr. et al. | 362/800 X |
| 4,284,884 | 8/1981 | Dyment et al. | 250/205 |
| 4,344,691 | 8/1982 | Grant et al. | 355/1 |
| 4,435,064 | 3/1984 | Tsukada et al. | 355/1 |
| 4,462,662 | 7/1984 | Lama | 355/1 |
| 4,576,464 | 3/1986 | Sakata et al. | 355/3 R |
| 4,605,943 | 8/1986 | Nakamura et al. | 357/17 |
| 4,630,180 | 12/1986 | Muraki et al. | 362/223 |
| 4,641,944 | 2/1987 | Honda et al. | 355/1 |
| 4,721,977 | 1/1988 | Fukae | 355/3 R |
| 4,728,982 | 3/1988 | Takemura | 355/70 X |
| 4,734,734 | 3/1988 | Yano | 355/3 R |

FOREIGN PATENT DOCUMENTS

| | | |
|---|---|---|
| 59-175174 | 10/1974 | Japan. |
| 51-132983 | 11/1976 | Japan ................... 355/3 R |
| 54-99586 | 6/1979 | Japan ................... 355/3 R |
| 60201678 | 10/1980 | Japan. |
| 56-6480 | 1/1981 | Japan ................... 355/3 R |
| 57-30389 | 2/1982 | Japan ................... 355/3 R |

OTHER PUBLICATIONS

Physics of Semiconductor Devices, pp. 759–763 and pp. 398–402, (2d Ed.).

Primary Examiner—Leo H. Boudreau
Assistant Examiner—Mark R. Powell
Attorney, Agent, or Firm—Finnegan, Henderson, Farabow, Garrett, & Dunner

[57] ABSTRACT

This invention provides a light emitter for generating light having a predetermined effective level of illuminance distribution over a defined region of a given size. The light emitter comprises a light emitting diode having a specified overall length for generating the predetermined effective level of illuminance distribution, including a central array of LED chips equally spaced from each other at a first interval, an end array of LED chips equally spaced from each other at a second interval smaller than the first interval. The light emitter also comprises a gap where there are no chips, the gap being larger than the first interval between the central array and the end array for alternatively maintaining the predetermined effective level of illuminance distribution and increasing the size of the defined region, and maintaining the size of the defined region and decreasing the overall length of the diode. The light emitter comprises a circuit board for supporting the light emitting diode.

5 Claims, 4 Drawing Sheets

LIGHT EMITTING DIODE ARRAY HAVING UNIFORM ILLUMINANCE DISTRIBUTION

BACKGROUND OF THE INVENTION

1. Field of the Invention

This invention relates to a light emitter. In particular, it relates to light-emitting diode arrays (hereafter abbreviated as "LED arrays") used in the solid state light sources of photo-copiers, facsimile machines, and the like.

2. Description of the Related Art

An example of a conventional LED array is shown in cross-section in FIG. 1. In the drawing, reference numerals 101, 101 ... represent LED chips arranged in a straight line on a glass epoxy printed circuit board (hereafter abbreviated as "board"). The chips are arranged at equal distances from each other. Moreover, immediately above this group of LED chips and parallel to them, a cylindrical lens 103 is secured to board 102 by a holder 104, which doubles as a reflector. Incidentally, a light receiving surface 105 is mounted above cylindrical lens 103 and separated from it by about 30 mm.

In order to obtain a specified illuminance from this conventional LED array, the individual chips of this group of LED chips are arranged at equal spacings of, for example, 5mm apart, as shown in FIG. 1. Since the illuminance distribution C declines markedly at both ends of the array, as shown in FIG. 2, the region of even illuminance, referred to as the effective illuminance region A, is shorter than the overall length B of the LED array.

Since the illuminance distribution C decreases at the ends in an LED array of conventional construction, as mentioned above, the overall length of the LED array needs to be longer than the required effective illuminance region. However, there is a great problem that, in order to make a compact shape for machines such as photo-copiers and facsimile machines in which LED arrays are used, where there are no chips, the gap being in many cases it is difficult to obtain the desired characteristic the overall length of the LED array is shortened and because of space restrictions inside the machine in which the LED array is installed.

SUMMARY OF THE INVENTION

An object of this invention is to reduce the size of a light emitter while maintaining the required effective illuminance region.

Another object of this invention is to maintain the effective level of illuminance distribution from a given number of LED chips while increasing the size of the intensity region.

This invention improves the arrangement of LED chips in an example of a LED array in a light emitter, and thus the overall length of the LED array can be kept to the minimum necessary to obtain the required effective illuminance region. That is to say, the light emitter of this invention has the characteristic of being composed as follows. As shown in FIG. 6, a light-emitting diode chip group (101, 101 ...) is arranged on a printed circuit board (102). A lens 103 with a specified cross-sectional shape is placed above and parallel to the light-emitting surfaces of these light-emitting diode chips. This light-emitting diode chip group in the light emitter has a central region (P) in which the chips are arranged at a specified and equal spacing (p) from each other. On either side of this central region (P) there are chip-less regions (Q) in which there are no light-emitting diode chips. Beyond these, there are end regions (R) in which the individual chips of the light-emitting diode chip group are arranged at equal spacing from each other but more closely than in the central region (r, r<p).

Furthermore, this invention provides a light emitter for generating light having a predetermined effective level of illuminance distribution over a defined region of a given size, comprising: light emitting diode means having a specified overall length for generating the predetermined effective level of illuminance distribution, including a central array of LED chips equally spaced from each other at a first interval, an end array of LED chips equally spaced from each other at a second interval smaller than the first interval, and means defining a gap larger than the first interval between the central array and the end array for alternatively maintaining the predetermined effective level of illuminance distribution and increasing the size of the defined region, and maintaining the size of the defined region and decreasing the overall length of the diode means; and circuit board means for supporting the light emitting diode means.

DETAILED DESCRIPTION OF THE PREFERRED EMBODIMENTS

Figure 1:
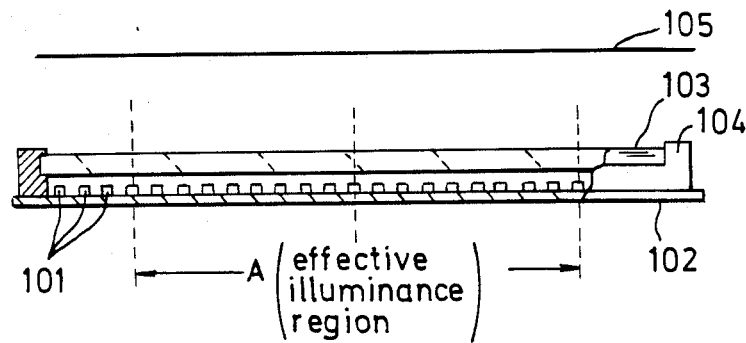
FIG. 1 is a partial cross-section of an elevation of a conventional LED array.
Figure 2:
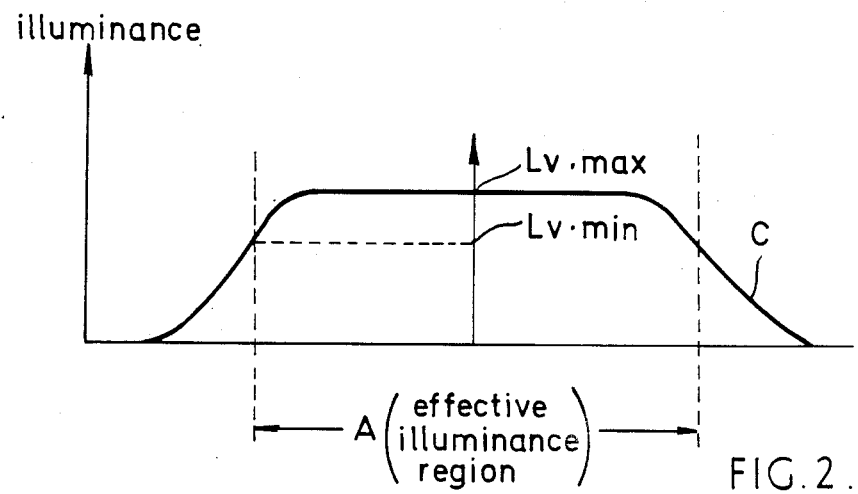
FIG. 2 is a graph showing the light illuminance distribution of a conventional LED array.
Figure 3:
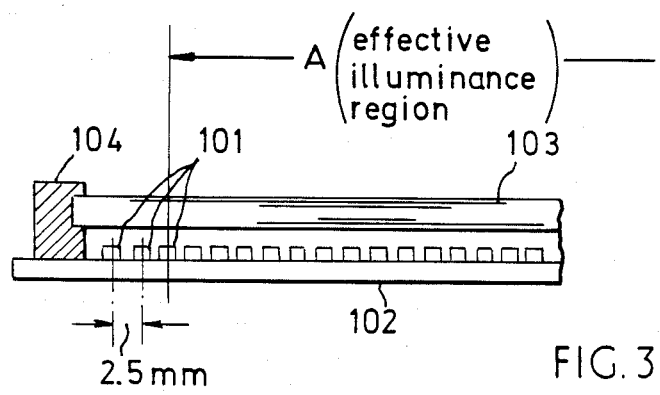
FIG. 3 is an elevation of part of a LED array shown in cross-section.
Figure 4:
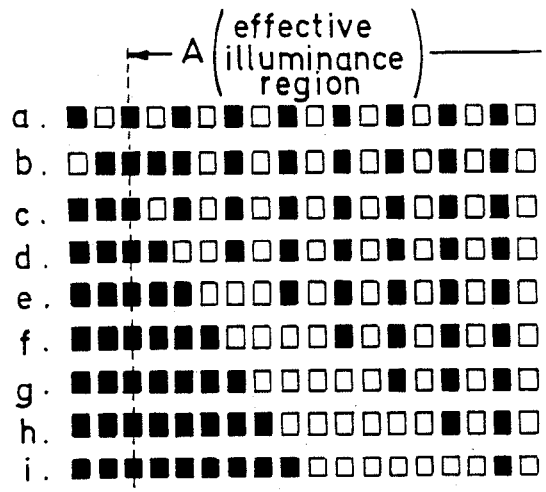
FIG. 4 is an explanatory drawing of LED chip arrangement in LED chip arrays.
Figure 5A:
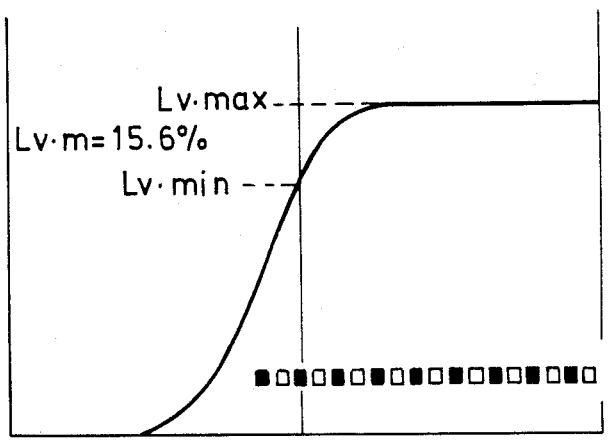
FIGS. 5(a) to (i) inclusive are all graphs showing parts of the light illuminance distribution due to different LED chip arrangements.
Figure 5B:
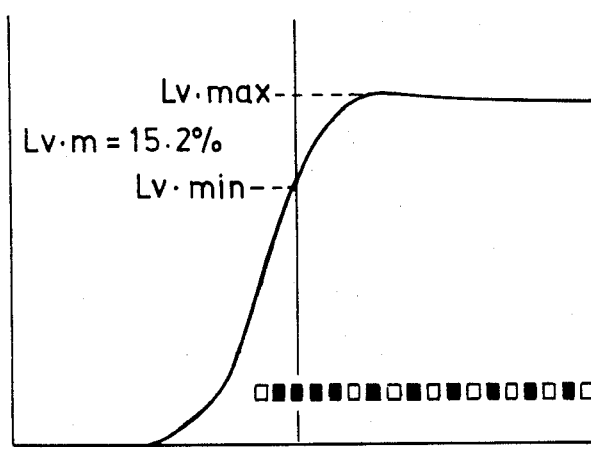
Figure 5C:
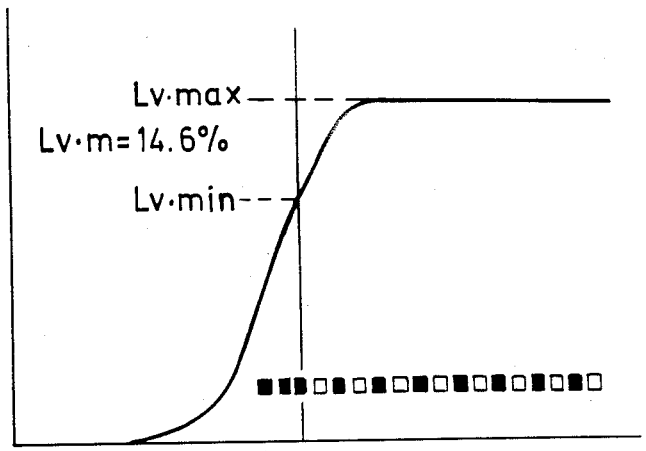
Figure 5D:
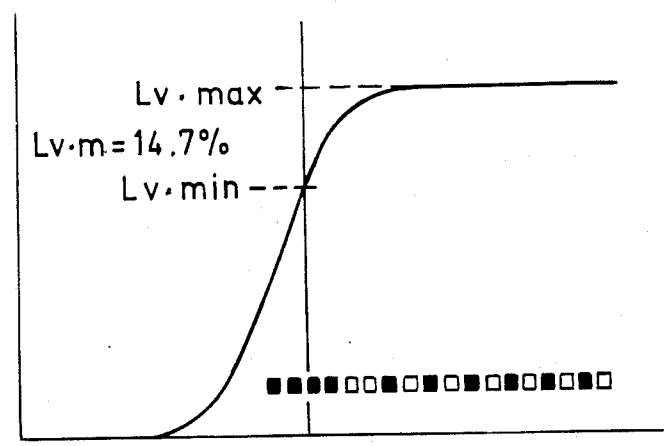
Figure 5E:
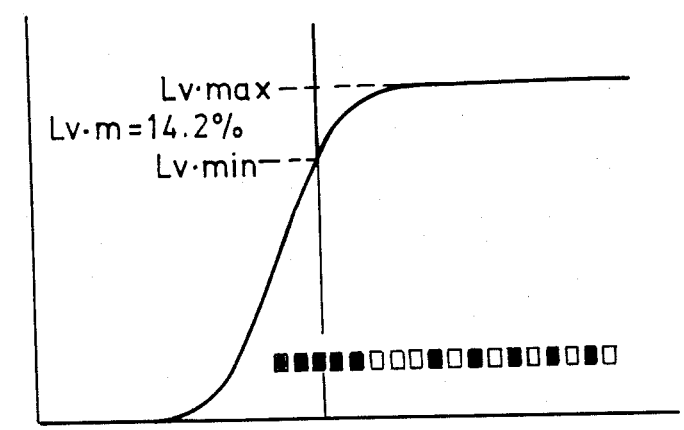
Figure 5F:
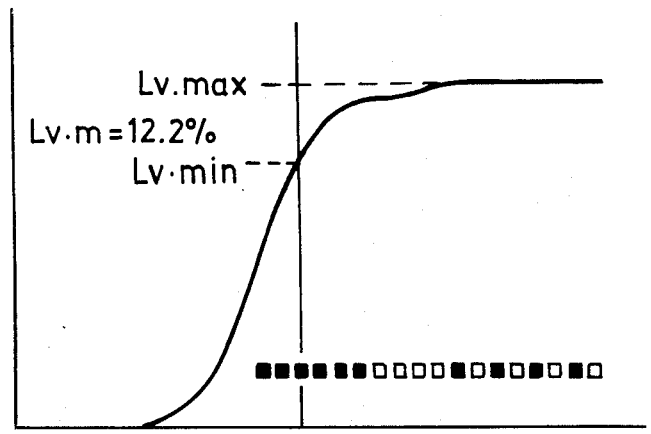
Figure 5G:
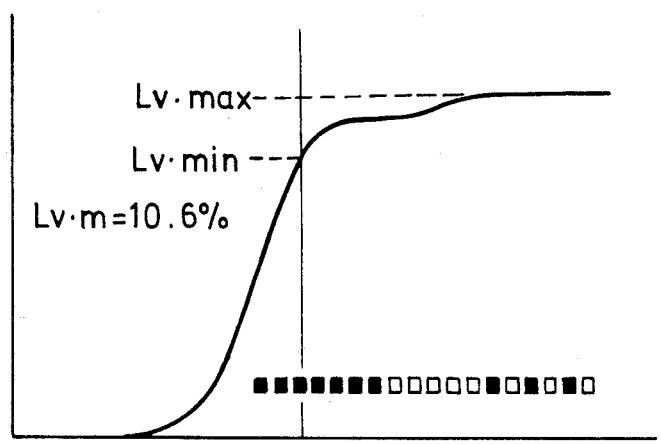
Figure 5H:
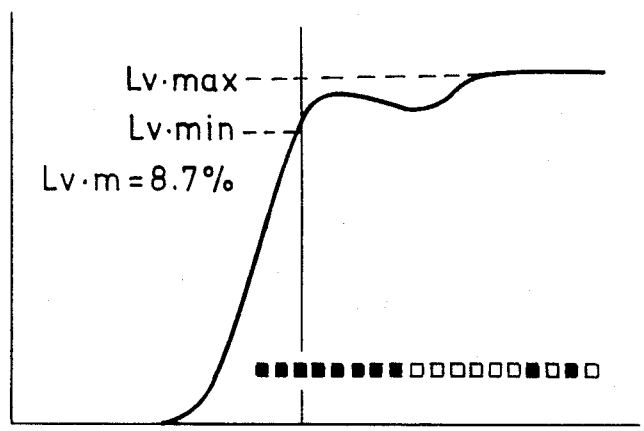
Figure 5I:
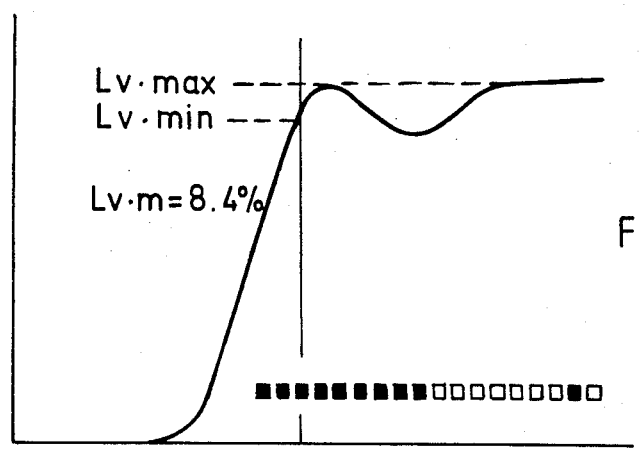

To achieve this invention, the randomness of the illuminance in the effective illuminance region is calculated by the equation.

$$Lvm = \frac{Lv \cdot \max - Lv \cdot \min}{Lv \cdot \max + Lv \cdot \min} \times 100 \ (\%)$$

for arrangements (a)-(i) ((a) is the conventional arrangement) in FIGS. 3, 4 and 5 (a)-(i) which are experimental arrangements of LED chips from the centers of LED arrays to one end. Moreover, the arrangement of one row of LED chips is shown with black squares at the bottom of each drawing in FIG. 5 (a)-(i). The white squares show chip beds in which no LED chip were set. Each arrangement of LED chips and its Lvm, etc, is shown in the following Table.

TABLE

| Arrangement See FIG. 5 | Actual Arrangement of LED Chips End - Center (See footnote*) | Lvm (%) | External Appearance |
| --- | --- | --- | --- |
| a | All coarse | 15.6 | Conventional construction |
| b | No-chip 1 - close 4 - coarse ... | 15.2 | |
| c | Close 3 - coarse ... | 14.6 | |
| d | Close 4 - no-chip 1 - coarse ... | 14.7 | |
| e | Close 5 - no-chip 3 - coarse ... | 14.2 | Good |
| f | Close 6 - no-chip 4 - coarse ... | 12.2 | Excellent |
| g | Close 7 - no-chip 5 - coarse ... | 10.6 | Level difference observed in non-chip region |
| h | Close 8 - no-chip 6 - coarse ... | 8.7 | As above |
| i | Close 9 - no-chip 7 - coarse ... | 8.4 | Pronounced level difference in non-chip region |

*The tests were conducted when the third light-emitting element chip from the end was at the end of the effective light-emitting region and when the close arrangement was 2.5 mm spacing between chip centers and the coarse arrangement was 5 mm.

As is clear from the above Table and from FIG. 5, the arrangement indicated by "f" has evenness and can obtain the most superior illuminance distribution in level differences. By this arrangement, the necessary overall LED array length can be kept to the minimum in order to obtain the required effective illuminance region.

Below is described the arrangement of LED chips in an embodiment of an LED array designed based on this invention. Incidentally, in order to simplify the description, parts which are the same as conventional parts have been given the same symbols in th drawings.

Figure 6:
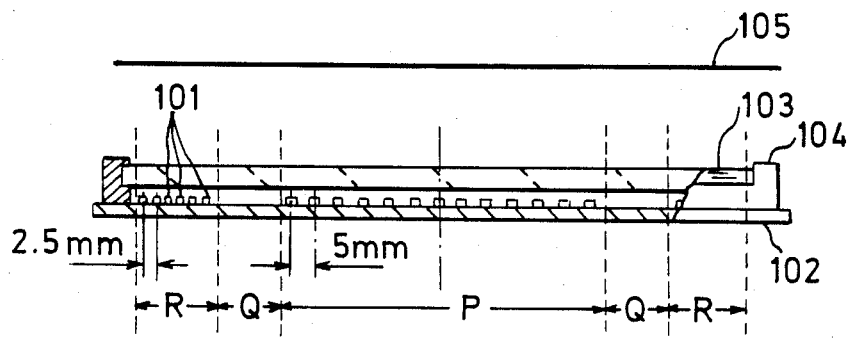
FIG. 6 is a partial cross-section of an elevation of an actual example of a LED array of this invention.
Figure 7:
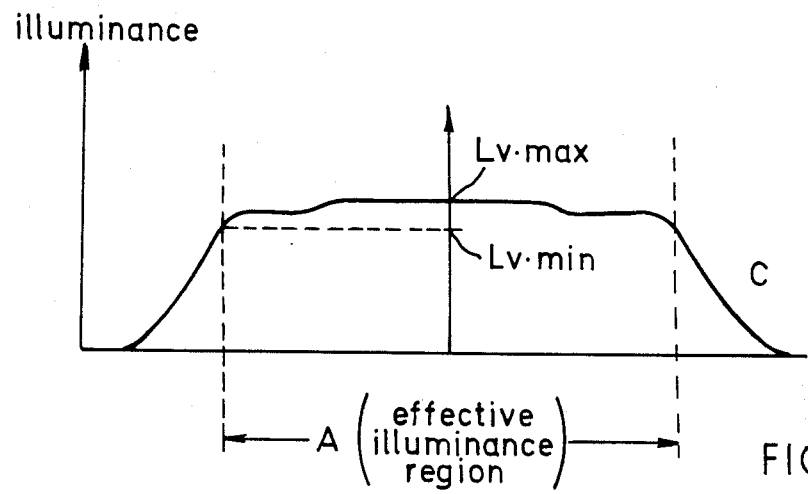
FIG. 7 is a graph showing the light illuminance distribution of an actual example of an LED array of this invention.

For the arrangement of the LED chip group 101, 101 ... shown in FIG. 6, the arrangement of the central region P is the same as in a conventional arrangement. For example, it is arranged with the LED chips spaced evenly at 5 mm between centers. Adjacent to central region P there are chip-less regions Q in which there are no LED chips, and beyond these regions Q there are end regions R in which the LED chips are spaced evenly at a distance between centers r of 2.5 mm. The chip-less regions Q have lengths equivalent to the spacing "r" of four LED chips in end regions R. End regions R have lengths of 6 chips at 2.5 mm intervals in the above-mentioned example. These intervals are closer than the distances between centers of the LED chips in central region P. Incidentally, in this case, the region from the third LED chip inwards in the end region, counting towards the center region from the extreme end, is taken as the effective illuminance region A. The light illuminance distribution C exhibited by a LED array of this design was excellent and, as shown in FIG. 7, had no reduction of illuminance in the end regions, with less randomness of measured illuminance.

When the radomness of the illuminance Lvm in the LED array of this embodiment is investigated for mass-produced items, it is typically 10% or less. This is highly satisfactory when compared with the 15% or less required in practical use, and is recognized as outstanding when compared with the conventional 20%.

If this invention is used, by providing regions without any LED chips between a central region and end regions as mentioned above, the quality can be improved by the reduction of randomness of illuminance. In addition, the overall length of an LED array can be reduced for a corresponding effective illuminance region.

Various modifications and variations could be made to the invention without departing from the scope or spirit of the invention.

What is claimed is:

1. A light emitter for generating light having a predetermined effective level of illuminance distribution over a defined region of a given size, comprising:

light emitting diode means having a specified overall length for generating the predetermined effective level of illuminance distribution, including a central array of LED chips equally spaced from each other at a first interval, an end array of LED chips equally spaced from each other at a second interval smaller than the first interval, and means defining a gap larger than the first interval between the central array and the end array for alternatively maintaining the predetermined effective level of illuminance distribution and increasing the size of the defined region, and maintaining the size of the defined region and decreasing the overall length of the diode means; and circuit board means for supporting the light emitting diode means.

2. The light emitter of claim 1 wherein the the second interval is at least twice the first interval.

3. The light emitter of claim 1 wherein the end array includes six LED chips, and the gap has a length between three and more times the second interval.

4. The light emitter of claim 1 wherein the end array includes six LED chips, and the gap has a length between three and seven times the second interval.

5. A method of reducing the length of a light emitter having an array of a plurality of LED chips, comprising the steps of:

(a) specifying an overall length for the array for generating a predetermined effective level of illuminance distribution;

(b) spacing a central array of LED chips equidistant from each other at a first interval;

(c) spacing an end array of LED chips equidistant from each other at a second interval smaller than the first interval; and (d) defining a gap larger than the first interval between the central array and the end array, said gap being defined for maintaining the predetermined effective level of illuminance distribution over a defined region of a given size and reducing the length of the light emitter.

* * * * *